US008893770B2

(12) United States Patent
Gamborg

(10) Patent No.: US 8,893,770 B2
(45) Date of Patent: Nov. 25, 2014

(54) HEAT SINK ASSEMBLY FOR ELECTRONIC COMPONENTS

(75) Inventor: Gorm Gamborg, Kolding (DK)

(73) Assignee: Schneider Electric It Corporation, West Kingston, RI (US)

( * ) Notice: Subject to any disclaimer, the term of this patent is extended or adjusted under 35 U.S.C. 154(b) by 538 days.

(21) Appl. No.: 13/193,837

(22) Filed: Jul. 29, 2011

(65) Prior Publication Data

US 2013/0025823 A1    Jan. 31, 2013

(51) Int. Cl.
*F28F 7/00* (2006.01)
*H05K 7/20* (2006.01)
*H01L 23/40* (2006.01)

(52) U.S. Cl.
CPC ........ *H01L 23/4093* (2013.01); *H01L 23/4006* (2013.01)
USPC .......... 165/80.3; 165/185; 361/704; 361/707; 361/708; 361/710; 361/719

(58) Field of Classification Search
USPC ............... 165/80.3, 185; 361/679.54, 679.58, 361/688–690, 703, 704, 709, 710, 719; 257/718, 719, 726, 727; 267/158, 159, 267/160, 179
See application file for complete search history.

(56) References Cited

U.S. PATENT DOCUMENTS

| | | | |
|---|---|---|---|
| 982,541 A * | 1/1911 | Smith ............................. | 24/535 |
| 4,575,038 A | 3/1986 | Moore | |
| 4,674,005 A | 6/1987 | Lacz | |
| 4,766,653 A | 8/1988 | Della Porta | |
| 4,872,089 A | 10/1989 | Ocken et al. | |
| 4,899,255 A | 2/1990 | Case et al. | |
| 4,923,179 A | 5/1990 | Mikolajczak | |
| 4,972,294 A | 11/1990 | Moses, Jr. et al. | |
| 5,077,638 A | 12/1991 | Andersson et al. | |
| 5,170,325 A | 12/1992 | Bentz et al. | |
| 5,283,467 A * | 2/1994 | Goeschel et al. ............. | 257/718 |
| 5,321,582 A | 6/1994 | Casperson | |
| 5,343,362 A | 8/1994 | Solberg | |

(Continued)

FOREIGN PATENT DOCUMENTS

DE    88 11 128 U1    12/1989
EP    1 696 717 A2    8/2006

OTHER PUBLICATIONS

Notification of Transmittal of the International Search Report and the Written Opinion of the International Searching Authority from corresponding PCT/US2012/048529 mailed Nov. 13, 2012.

(Continued)

*Primary Examiner* — Allen Flanigan
*Assistant Examiner* — Jason Thompson
(74) *Attorney, Agent, or Firm* — Lando & Anastasi, LLP

(57) ABSTRACT

One aspect of the disclosure is directed to a heat sink assembly for dissipating heat from an electronic component. The heat sink assembly includes a heat sink having a base and at least one fin extending from the base. The at least one fin has an opening formed therein that is configured to receive a fastener. The heat sink assembly also includes a clip. The clip has a first portion configured to receive the fastener and at least one second portion flexibly coupled to the first portion. The at least one second portion is configured to secure the heat sink to the electronic component proximate to the base in response to a force being applied to the first portion by the fastener.

17 Claims, 17 Drawing Sheets

(56) References Cited

U.S. PATENT DOCUMENTS

| | | | |
|---|---|---|---|
| 5,344,113 A | 9/1994 | Jurek | |
| 5,450,284 A | 9/1995 | Wekell | |
| 5,466,970 A | 11/1995 | Smithers | |
| 5,710,694 A * | 1/1998 | Chen | 361/703 |
| 5,731,955 A | 3/1998 | Bartanen et al. | |
| 5,875,096 A * | 2/1999 | Gates | 361/704 |
| 5,896,270 A | 4/1999 | Tsui | |
| 5,909,358 A | 6/1999 | Bradt | |
| 5,940,288 A | 8/1999 | Kociecki | |
| 5,991,151 A * | 11/1999 | Capriz | 361/704 |
| 5,995,369 A | 11/1999 | Kiermeier et al. | |
| 6,049,459 A * | 4/2000 | Edmonds et al. | 361/707 |
| 6,249,436 B1 | 6/2001 | Bollesen | |
| 6,373,704 B1 * | 4/2002 | Chen | 361/704 |
| 6,404,632 B1 * | 6/2002 | Forkas | 361/703 |
| 6,587,344 B1 | 7/2003 | Ross | |
| 6,617,685 B1 | 9/2003 | Bollesen | |
| 7,021,365 B2 | 4/2006 | Rearick et al. | |
| 2002/0060064 A1 | 5/2002 | Yu | |
| 2003/0070790 A1 | 4/2003 | Chen et al. | |
| 2005/0225945 A1 | 10/2005 | Liu | |
| 2011/0002104 A1 * | 1/2011 | Liu | 361/709 |

OTHER PUBLICATIONS

"Table of Contents: The Max Clip System(TM) Clip—Aavid", Jan. 1, 2005, pp. 1-40, XP55042899, Retrieved from the Internet: URL:http://www.aavid.com/sites/default/files/literature/MaxClip-Extrusion-Profiles-Catalog.pdf [retrieved on Nov. 1, 2012].

* cited by examiner

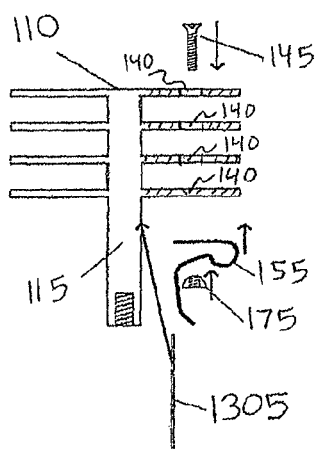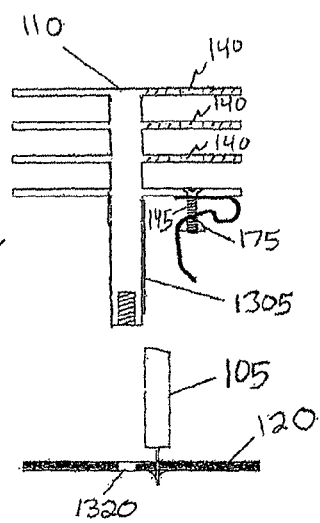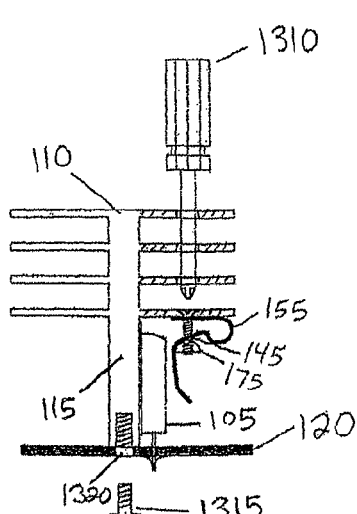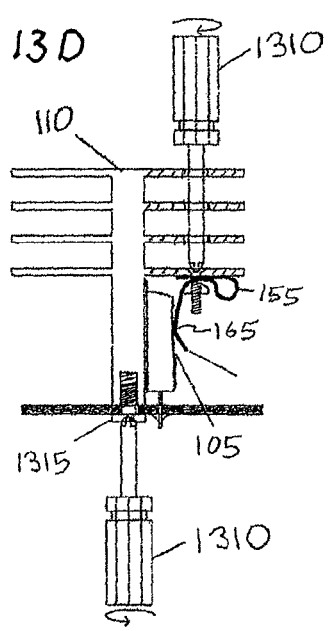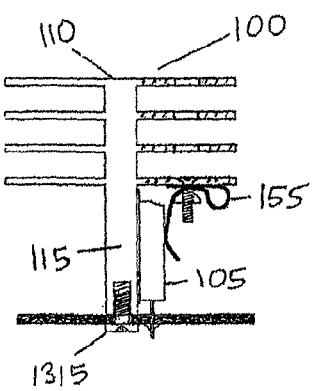

HEAT SINK ASSEMBLY FOR ELECTRONIC COMPONENTS

BACKGROUND

1. Field of Invention

At least one embodiment of the present invention relates generally to a heat sink assembly, and more specifically, to assemblies and methods for securing heat sinks to electronic components.

2. Discussion of Related Art

Electronic devices generate heat during operation. Heat exchange devices, commonly referred to as heat sinks, can attach to electronic devices to transfer heat energy away from the electronic devices to a fluid medium such as air. Excessive heat limits or reduces the operational performance of the electronic devices. Heat exchange devices generally have a larger surface area exposed to air than the electronic device (or portion thereof) to which the heat exchange devices are attached. The larger surface area generally provides an increased heat transfer capacity relative to the electronic device.

SUMMARY OF THE INVENTION

Aspects and embodiments of the present disclosure are directed to systems and methods of dissipating heat from electronic components. A heat sink assembly includes a heat sink and a clip to secure electronic components with the heat sink. The heat sink assembly provides a heat transfer path from the electronic component to the surrounding environment.

One aspect of the disclosure is directed to a heat sink assembly for dissipating heat from an electronic component. The heat sink assembly includes a heat sink having a base and at least one fin extending from the base. The at least one fin has an opening formed therein that is configured to receive a fastener. The heat sink assembly also includes a clip. The clip has a first portion configured to receive the fastener and at least one second portion flexibly coupled to the first portion. The at least one second portion is configured to secure the heat sink to the electronic component proximate to the base in response to a force being applied to the first portion by the fastener.

In some embodiments, the first portion of the clip is generally V-shaped, and the first portion includes a first leg coupled to a second leg. The first leg has a first leg opening, and the second leg has a second leg opening. The first leg opening and the second leg opening can receive the fastener and align with the opening of the at least one fin. In one embodiment, a fastening bar is configured to compress the second leg against the first leg when securing the fastening bar and the clip to the at least one fin and to spring bias the at least one second portion against the electronic component. The fastening bar can include a fastener bar opening to receive the fastener. The fastener bar opening is aligned with the opening of the at least one fin, the first leg opening and the second leg opening. The first portion of the clip includes a curved portion connecting the first leg and the second leg. The first leg and the second leg pivot about the curved portion responsive to the force being applied to the first portion by the fastener. The curved portion can form a loop responsive to the force being applied to the first portion by the fastener. In one embodiment, the clip includes a plurality of second portions spatially positioned along a length of the first portion to secure a plurality of electronic components proximate to the base of the heat sink.

Another aspect of the disclosure is directed to a heat sink assembly for dissipating heat from an electronic component. The heat sink assembly includes a heat sink having a base and a first fin extending from a first surface of the base. The first fin includes a first opening formed therein that is configured to receive a fastener. A second fin extends from the first surface of the base. The second fin is disposed above the first fin and has a second opening that is aligned with the opening of the first fin and configured to receive the fastener therethrough. The heat sink assembly also includes a clip. The clip has a first portion with a clip opening configured to align with the first opening of the first fin to receive the fastener to secure the clip to the first fin in response to a force being applied to the first portion by the fastener.

In some embodiments, the clip includes a second portion configured to spring bias the electronic component against the base of the heat sink in response to the force being applied to the first portion by the fastener. The first fin and the second fin extend from the base in a parallel configuration. In one embodiment, the heat sink assembly includes a third fin extending from a second surface of the base opposite to the first surface of the base. The third fin has an opening formed therein that is configured to receive a second fastener. The first portion of the clip includes a first leg and a second leg, and the clip opening includes a first leg opening and a second leg opening. The first leg opening and the second leg opening can align with the first opening of the first fin to receive the fastener. In one embodiment, a top surface of the first portion of the clip is configured to contact a bottom surface of the first fin responsive to the force being applied to the first portion by the fastener. The heat sink assembly can also include a fastening bar having an opening formed therein that is configured to threadably receive the fastener to secure the clip to the heat sink.

Another aspect of the disclosure is directed to a method of securing a heat sink assembly to an electronic component. The heat sink assembly includes a clip and a heat sink. The heat sink has a base and a first fin extending from the base. The method includes positioning the heat sink assembly on the electronic component in such a manner that the base is disposed laterally adjacent the electronic component. The method includes attaching a first portion of the clip to a bottom surface of the first fin of the heat sink, the first portion of the clip having a first leg and a second leg. The method also includes applying force to the second leg of the clip toward the first leg of the clip to drive a movement of the second portion of the clip against the electronic component.

In some embodiments, the act of applying force to the second leg of the clip against the electronic component positions at least a portion of a lateral surface of the electronic component adjacent to the base of the heat sink, and positions at least a portion of a top surface of the electronic component proximate to the bottom surface of the fin of the heat sink. The method can also include biasing the second portion of the clip toward the electronic component to secure the portion of the lateral surface of the electronic component against a surface of the base of the heat sink with a fastener that secures the clip to the first fin of the heat sink. In one embodiment, the heat sink includes a second fin disposed above the first fin, the first fin having a first opening and the second fin having a second opening aligned with the first opening of the first fin, and the method includes securing the fastener by accessing the fastener through the second opening of the second fin formed in the fin of the heat sink.

Still other aspects, embodiments, and advantages of these exemplary aspects and embodiments, are discussed in detail below. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to describe explain the claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the disclosure. In the figures:

FIGS. 13A-13E are sequential side elevational views of one example of a method for securing a heat sink to an electronic component, with portions of the heat sink assembly depicted in cross section, according to aspects of the present disclosure;

DETAILED DESCRIPTION

Various aspects and embodiments are directed to a heat sink assembly and methods for securing a heat sink to an electronic component to dissipate heat from the electronic component. According to one embodiment, the heat sink assembly includes a heat sink having a base and at least one fin. The fin extends from the base and the fin includes an opening configured to receive a fastener. The heat sink assembly also includes a clip. A first portion of the clip is configured to receive the fastener. A second portion of the clip is flexibly coupled with the first portion. The second portion of the clip is also configured to secure the heat sink with the electronic component responsive to a force being applied to the first portion of the clip by the fastener.

Embodiments of the devices and methods discussed herein are not limited in application to the details of construction and the arrangement of components set forth in the following description or illustrated in the accompanying drawings. The devices and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to top and bottom, lateral, or upper and lower are intended for convenience of description, not to limit the present systems and methods or their components to any one positional or spatial orientation.

Figure 1:
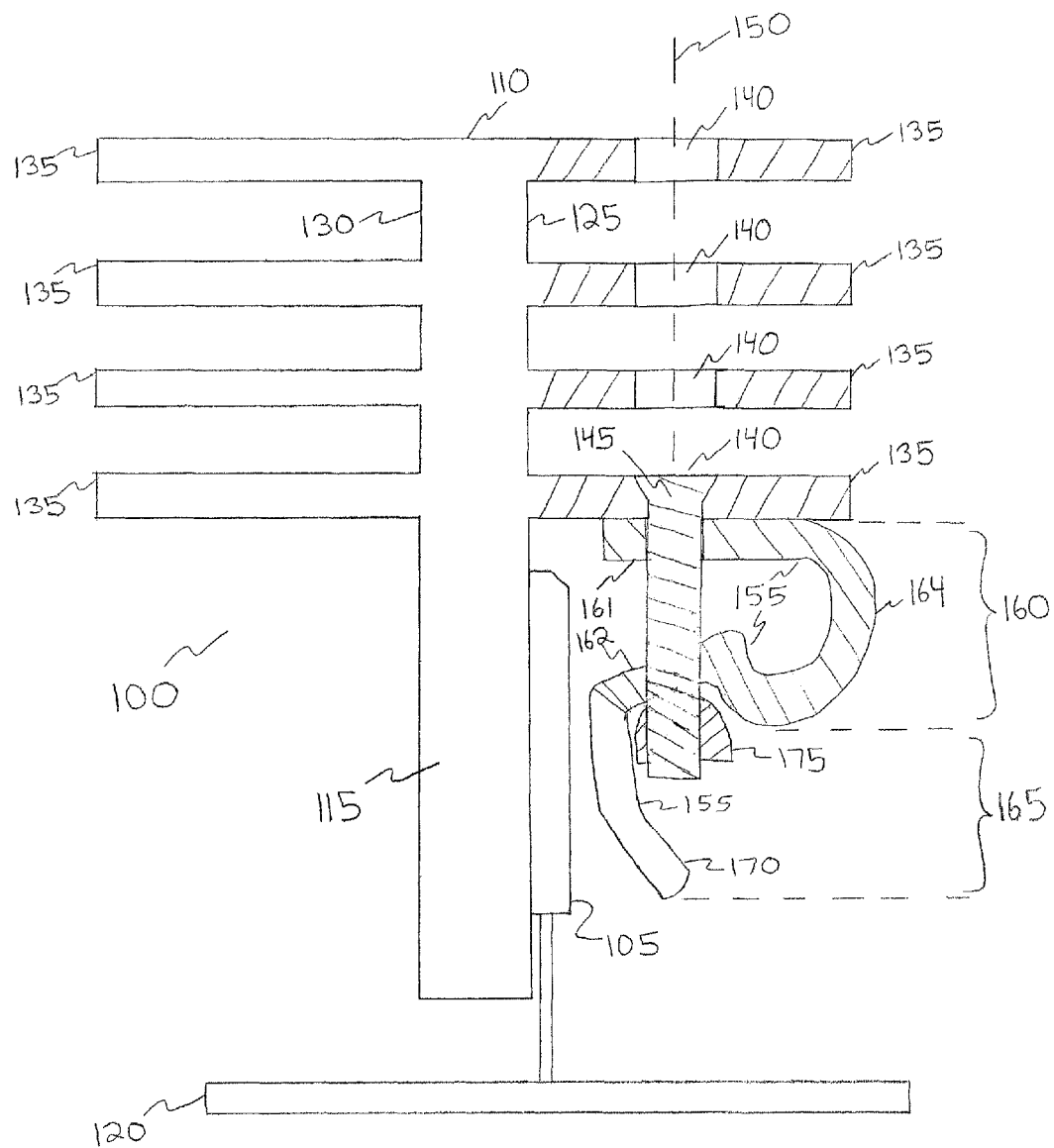
FIG. 1 is a side elevational view of one example of a heat sink assembly with portions of the heat sink assembly depicted in cross section, according to aspects of the present disclosure, positioned on an electronic component.

Referring to FIG. 1, there is illustrated a perspective view of a heat sink assembly 100, which is capable of dissipating heat from an electronic component 105, such as a semiconductor device. The heat sink assembly 100 includes a heat sink 110, which has a base 115. In one embodiment, the electronic component 105 can be mounted on a printed circuit board 120. In this example, the heat sink assembly 100 is secured to a plurality of electronic components 105 that extend in-line with each other.

The base 115 of the heat sink 110 includes a first surface 125 and a second surface 130. Several fins 135 can extend from the base 115 from either the first surface 125, the second surface 130, or both. The fins 135 may extend in a parallel configuration from the first surface 125 or the second surface 130 of the base 115 as depicted in FIG. 1. The fins 135 extending from the first surface 125 of the base 115 each include an opening 140 formed therein. The openings 140 of the three uppermost fins 135 are each configured to completely receive a fastener 145, such as a screw, pin, bolt, or rivet therethrough. The opening 140 of the lowermost fin 135 can be configured to receive a head of the fastener 145. The fastener 145 and the fins 135 extending from the first surface 125 of the base 115 are illustrated in cross section in FIG. 1.

In one embodiment, the openings 140 of the fins 135 are aligned with each other, as illustrated in FIG. 1, generally along a vertical axis 150. As described above, the fastener 145 can pass through each opening 140 of the three uppermost fins along the axis 150 to engage a lowermost one of the fins 135. The fastener 145 is provided to secure the heat sink 110 to a clip 155, the purpose of which will become apparent as the description of the heat sink assembly 100 proceeds. The clip 155 is partially illustrated in cross section in FIG. 1. The clip 155 includes a first portion 160 configured to receive the fastener 145. The first portion 160 of the clip 155 includes a first leg 161 and a second leg 162. The first leg 161 and the second leg 162 can each include an opening aligned to receive the fastener 145 therethrough. In one embodiment, the first leg 161 and the second leg 162 extend from a curved segment 164 of the first portion 160 of the clip 155, which gives the first portion 160 a generally V-shaped configuration, as illustrated in FIG. 1.

The clip 155 also includes a second portion 165. The second portion 165 protrudes from the first portion 160 and in one embodiment the second portion 165 is integrally formed with the first portion 160 so that the second portion 165 extends from the first portion 160 at an angle with respect to the first portion 160. In this example, during use, the second portion 165 can be brought into contact with the electronic component 105 responsive to force induced on the clip 155 by the fastener 145. The second portion 165 may include an end segment 170 that, for example, flares outwardly. In one embodiment, the end segment 170 extends away from the electronic component 105 during use to prevent the tip of the end segment 170 from scratching or damaging the electronic component 105.

The heat sink assembly 100 also includes a fastening bar 175 having an opening formed therein to receive the fastener 145. The fastening bar 175 is illustrated in cross section in FIG. 1. In one embodiment, the fastening bar 175 is a generally longitudinally shaped metal, alloy, or polymer configured to be disposed beneath the first portion 160 of the clip 155 during use. In an alternate embodiment, the fastening bar 175 is a nut or other suitable fastener configured to receive and secure the fastener 145. As depicted in FIG. 1, with the generally V-shaped configuration, the heat sink assembly is in a disengaged position where the clip 155 does not yet secure the electronic component 105 with the base 115 of the heat sink 110.

Figure 2:
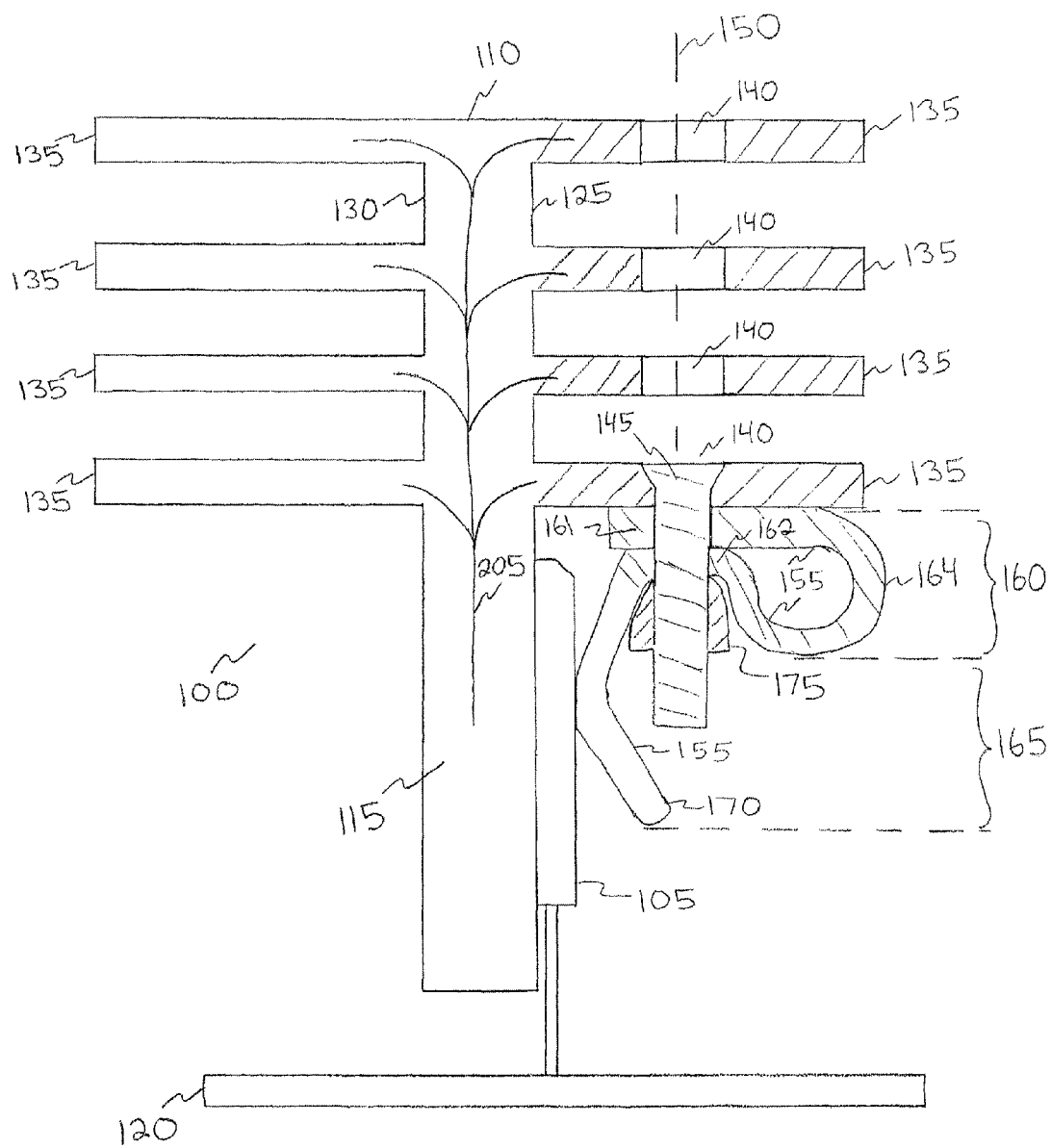
FIG. 2 is a side elevational view of the heat sink assembly shown in FIG. 1, with portions of the heat sink assembly depicted in cross section, according to aspects of the present disclosure, secured to the electronic component.

Referring to FIG. 2, the heat sink assembly 100 is illustrated in an engaged position. In one embodiment, the fastener 145 is fastened to the clip 155, and the fastener 145 together with the fastening bar 175 applies force to the clip 155 when securing the heat sink assembly 100 to the electronic component 105 (e.g., by screw fastening the fastener 145 to the fastening bar 175). For example, referring to FIGS. 1 and 2, the fastener 145 applies force to the clip 155 by drawing the fastening bar 175 against the clip 155 to drive the movement of the first leg 161 and the second leg 162 of the first portion 160 together. This spring motion biases the second portion 165 toward the electronic component 105. At least a part of the second portion 165 engages the electronic component 105 to secure it in position against the base 115 of the heat sink 110, thus securing the heat sink assembly 100 to the electronic component 105 and providing for thermal transfer from the electronic component 105 to the heat sink 110.

In this assembled position, the first leg 161 and the second leg 162 of the first portion 160 are secured to a bottom surface of the lowermost fin 135 by the fastening bar 175. The application of force by the fastener 145 and the fastening bar 175 drives the first leg 161 and the second leg 162 together. The curved segment 164 of the first portion 160 of the clip 155, which gives the first portion 160 the generally V-shaped configuration of FIG. 1 closes to form the generally loop-shaped configuration of FIG. 2.

In one embodiment, the fastener 145 and the fastening bar 175 secures the clip 155 to the lowermost fin 135 via top down access through the wider openings 140 of the three uppermost fins 135 along the axis 150. For example, a human operator with a tool (e.g., screwdriver) can extend the tool through the plurality of openings 140 to access the fastener 145 (e.g., screw). This assembly process may be automated, for example as part of an assembly line and the fastening may occur in the absence of direct human intervention. This top down access can facilitate assembly of the heat sink assembly 100 when, for example, lateral access to the heat sink assembly 100 is blocked due to the positioning of components on the printed circuit board 120 in, for example, a high density power electronics system.

In one embodiment, the heat sink assembly 100 is configured to minimize the thermal path from the electronic component to the fins 135. For example, the clip 155 and the fastener 145 are generally not part of the primary thermal path 205 between the electronic component 105 and the heat sink 110. Rather, the clip 155 can secure the electronic component 105 directly to the heat sink 110, and the thermal path 205 passes directly from the electronic component 105 to the heat sink 110 in the absence of intervening thermally passive solid materials. It is appreciated that the presence of thermally passive materials in a thermal path can reduce the efficiency of the heat transfer. In one embodiment, thermal paste, thermal grease or other thermally active material is present between the electronic component 105 and the heat sink 110 to enhance the thermal connection between the heat sink 110 and the electronic component 105. A thermal pad can also be present between the electronic component 105 and the heat sink 110 to provide electrical insulation between the heat sink 110 and the electronic component 105.

Figure 3:
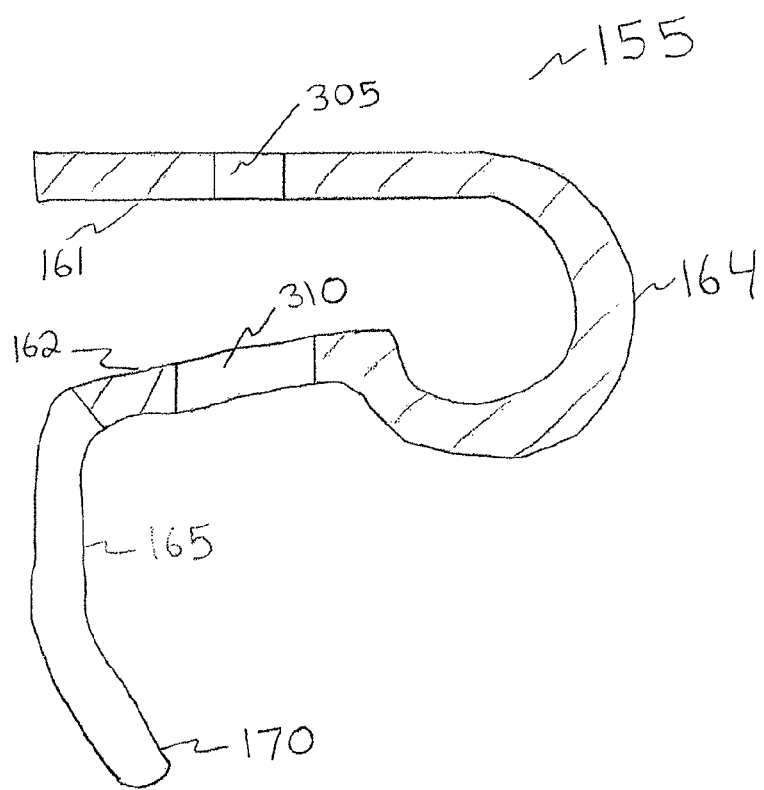
FIG. 3 is a cross-sectional view of a clip of the heat sink assembly according to aspects of the present disclosure.

Referring to FIG. 3, there is illustrated a cross-sectional elevational view of the clip 155 of the heat sink assembly 100. As depicted in FIG. 3, the first leg 161, the second leg 162, and the curved segment 164 form the generally V-shaped configuration, and the clip 155 is in a resting, non-biased position. The first leg 161 of the clip 155 includes a first leg opening 305 and the second leg 162 of the clip 155 includes a second leg opening 310. The first leg 305 opening and the second leg opening 310 can be circular, elliptical, or oval, and are configured to align with each other as well as the opening 140 of the fin 135 to receive a fastener (not illustrated in FIG. 3). In one embodiment, the second leg opening 310 is larger than the first leg opening 305. For example, the second leg opening 310 can embody a slot, which is shown in FIG. 3, or the opening can have a larger circumference, diameter, or radius than the first leg opening 305. The larger size of the second opening 310 can facilitate alignment with the first opening 305 to receive at least a portion of the fastener.

Figure 4:
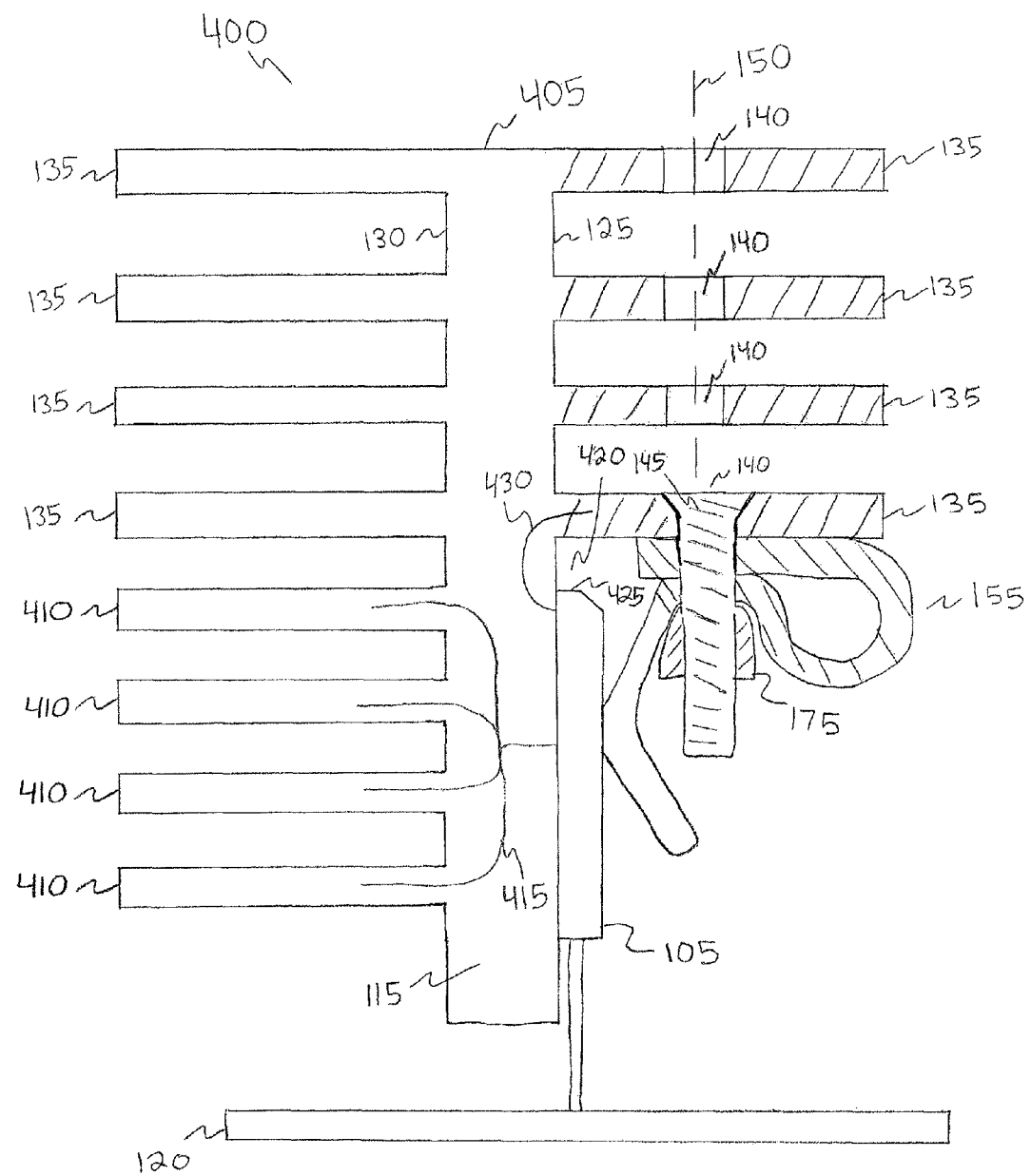
FIG. 4 is a side elevational view of another example of a heat sink assembly with portions of the heat sink assembly depicted in cross section, according to aspects of the present disclosure, secured to an electronic component.

Referring to FIG. 4, there is illustrated a perspective view of a heat sink assembly 400 of another embodiment with the heat assembly being secured to an electronic component 105. As shown, the heat sink assembly 400 includes a heat sink 405 having a base 115. Several fins 135 extend from the base 115. The heat sink 405 also includes several fins 410 that extend from the base 115 opposite to the electronic component 105 relative to the heat sink 405. The fins 410 provide additional thermal paths 415 for heat dissipation. A gap 420 is present between a top surface 425 of the electronic component 105 and a lowermost one of the fins 135 that is above the electronic component 105. In one embodiment, the gap 420 is an air gap that is free of thermally passive solid materials, providing a more direct thermal path 430 between the top surface 425 of the electronic component 105 and the lowermost fin 135 that is nearest the top surface 425. In this configuration, the top surface 425 of the electrical component 105 is proximate to the lowermost fin 135, separated by the gap 420, with a lateral surface of the electronic component 105 adjacent to the base 115.

Figure 5:
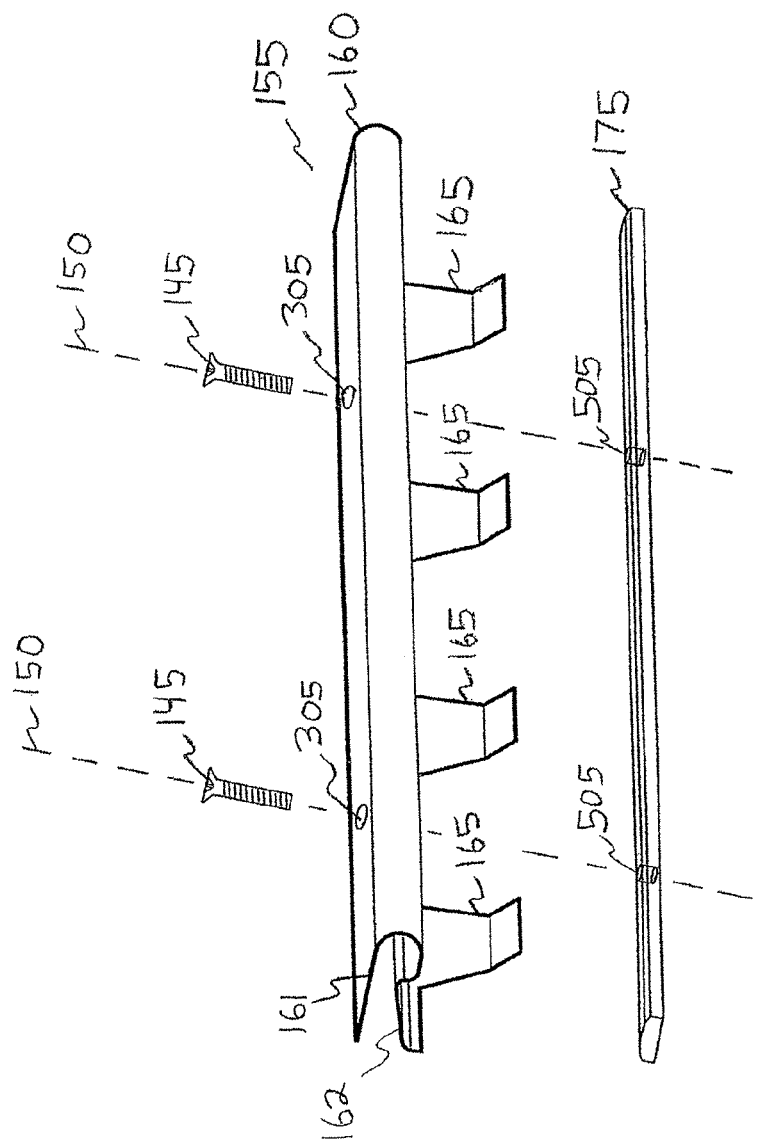
FIG. 5, is an exploded perspective view of one example of components of a heat sink assembly, according to aspects of the present disclosure.

Referring to FIG. 5, there is illustrated an exploded perspective view of the clip 155, fasteners 145, and the fastening bar 175 of a heat sink assembly, such as the heat sink assembly 100 of FIG. 1, or the heat sink assembly 400 of FIG. 4. In one embodiment, the clip 155 includes two first leg openings 305 to receive one of the fasteners 145. The fasteners 145 pass through the first leg openings 305 formed in the first legs 161 of the first portion 160 of the clip 155. Each fastener 145 is threadably received within an opening 505 of the fastening bar 175 to secure the fastener 145 to the fastening bar 175. Fastening of the fastener 145 to the fastening bar 175 applies force that compresses the first portion 160 of the clip 155. This force biases the second portion 165 of the clip 155 from, for example, the disengaged position of FIG. 1 to the engaged position of FIG. 2 against the electronic component 105.

Figure 6:
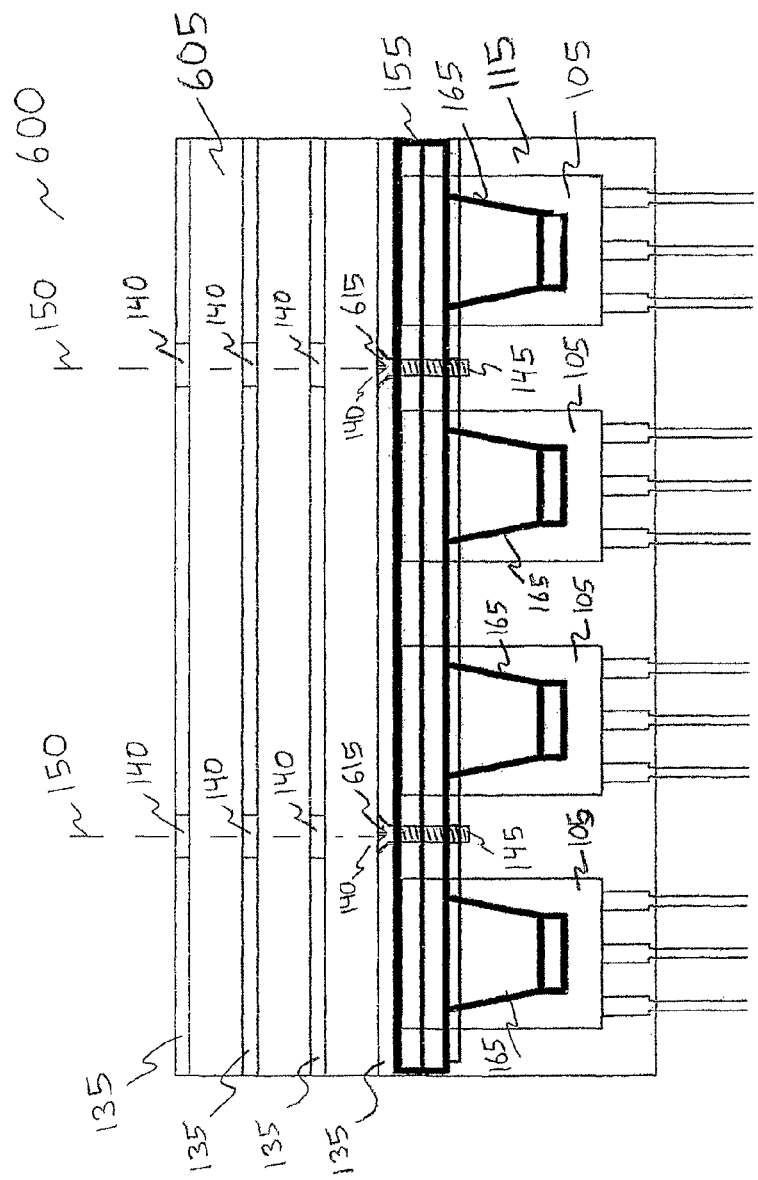
FIG. 6 is a front elevational view of one example of a heat sink assembly, according to aspects of the present disclosure, secured to several electronic components.

FIG. 6 is a front elevational view of one example of a heat sink assembly 600. Heat sink assembly 600 includes a heat sink 605 having a base 115. In the example of FIG. 6, the heat sink 605 has four fins 135 extending from the base 115. Each of the fins 135 has two openings 140. Fasteners 145 are configured to pass through the wider openings 140 of the top three of the fins 135 along the respective vertical axis 150. Each opening 140 of the lowermost fin 135 is configured to engage a head 615 of the respective fastener 145. In the engaged position depicted in FIG. 6, the fasteners 145 fasten the clip 155 to the lowermost fin 135. Each of the four second portions 165 of the clip 155 secures a respective electronic component 105 into position against the base 115. It is appreciated that the clip 155 can secure more than or fewer than four components 105 to the heat sink 605.

Figure 7:
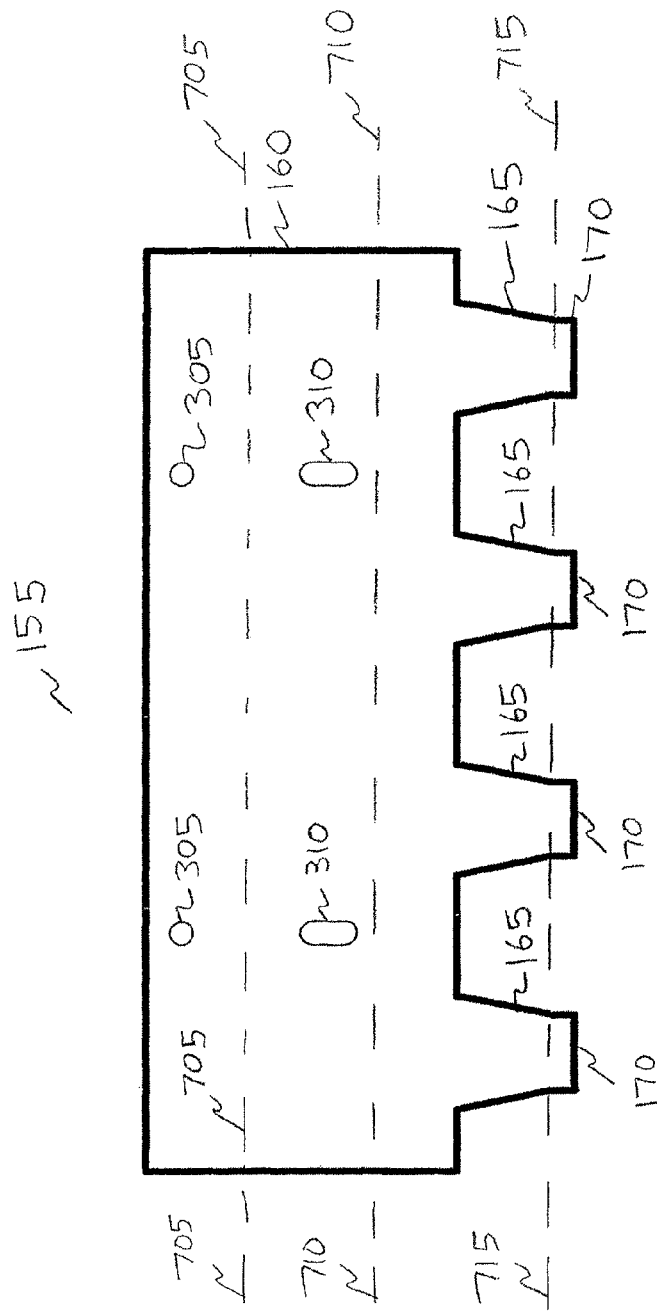
FIG. 7 is a plan view of one example of a clip of a heat sink assembly prior to being formed into its operational configuration, according to aspects of the present disclosure.

FIG. 7 is a plan view of one example of the clip 155 of a heat sink assembly prior to being formed into its operational configuration. The first portion 160 of the clip 155 has two first leg openings 305 and two second leg openings 310. The first openings 305 are circular and the second openings 310 are slot shaped, although other shapes are possible, such as elliptically shaped. The second openings 310 have a larger open area than the first openings 305 to facilitate alignment with first openings 305 and to facilitate receipt of the fastener.

Figure 8:
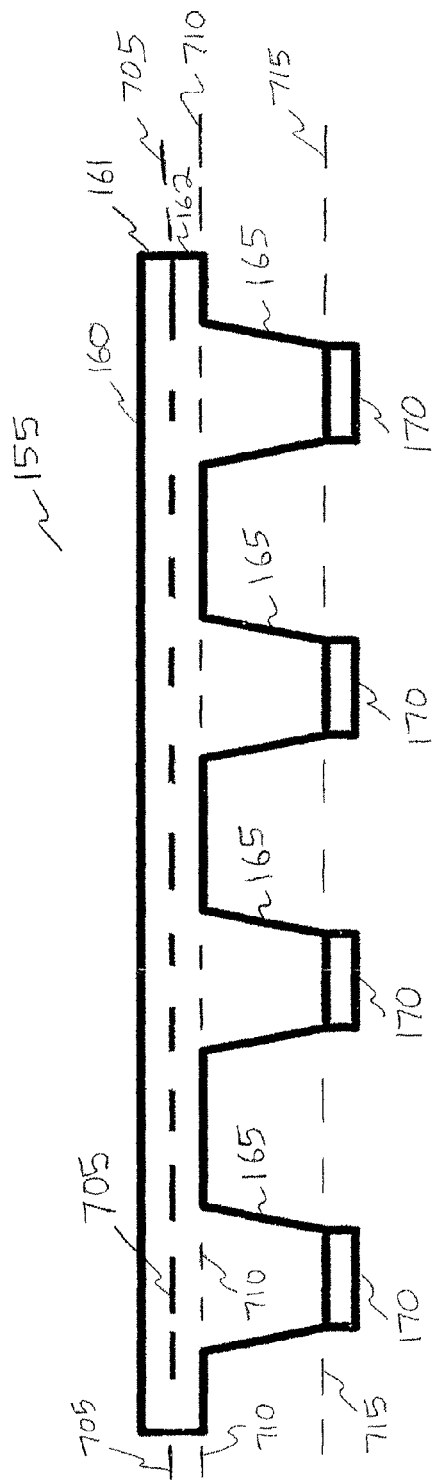
FIG. 8 is a front elevational view of one example of the clip of FIG. 7 after being formed into its operational configuration, according to aspects of the present disclosure.

In one embodiment, the clip 155 is formed from spring steel configured to bend into the position depicted in FIG. 8. The clip 155 generally bends about horizontal axis 705 and horizontal axis 710 to change shape from the pre-operational configuration of FIG. 7 to the operational configuration of FIG. 8. The horizontal axis 705 generally forms the boundary between the first leg 161 and the second leg 162 of the first portion 160 of the clip 155. The horizontal axis 710 generally forms the boundary between the first portion 160 and the second portion 165 of the clip 155. The clip 155 also bends about the horizontal axis 715 to form the end segment 170. In one embodiment, the clip 155 is heat treated after it is formed into the position of FIG. 8 to obtain the desired spring characteristics. The horizontal axis 705 extends horizontally between the first leg and the second leg of the first portion 160.

Figure 9:
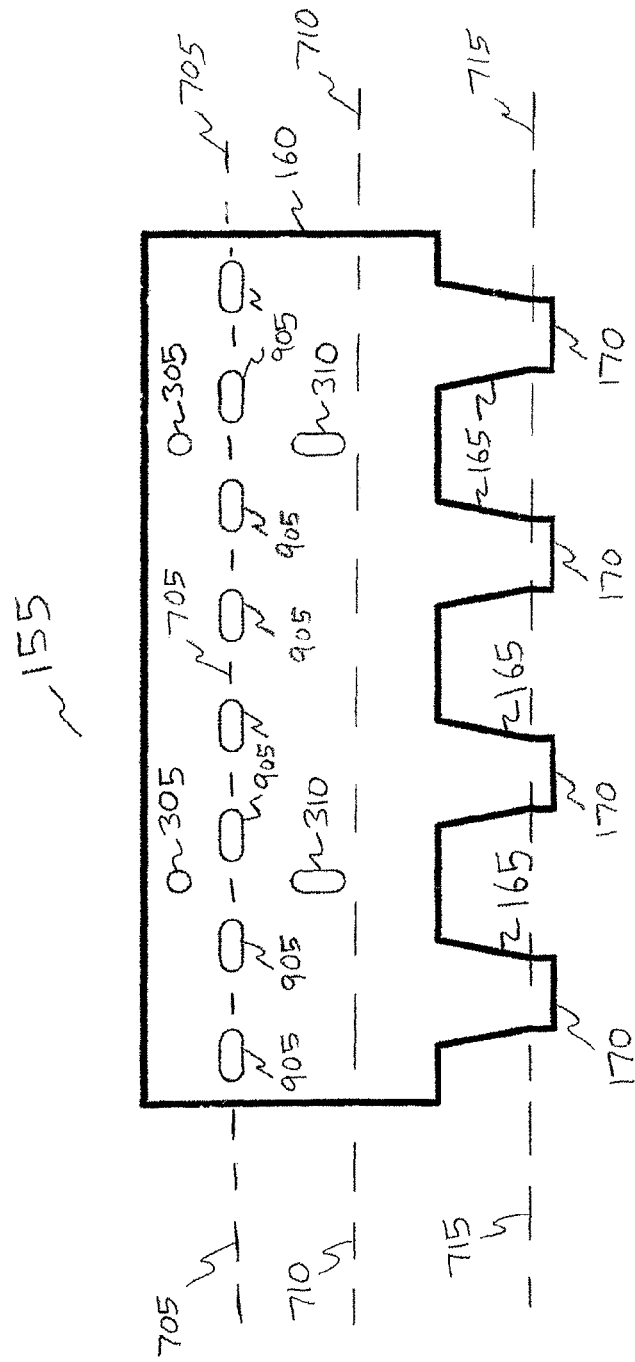
FIG. 9 is a plan view of another example of a clip of a heat sink assembly prior to being formed into its operational configuration, according to aspects of the present disclosure.
Figure 10:
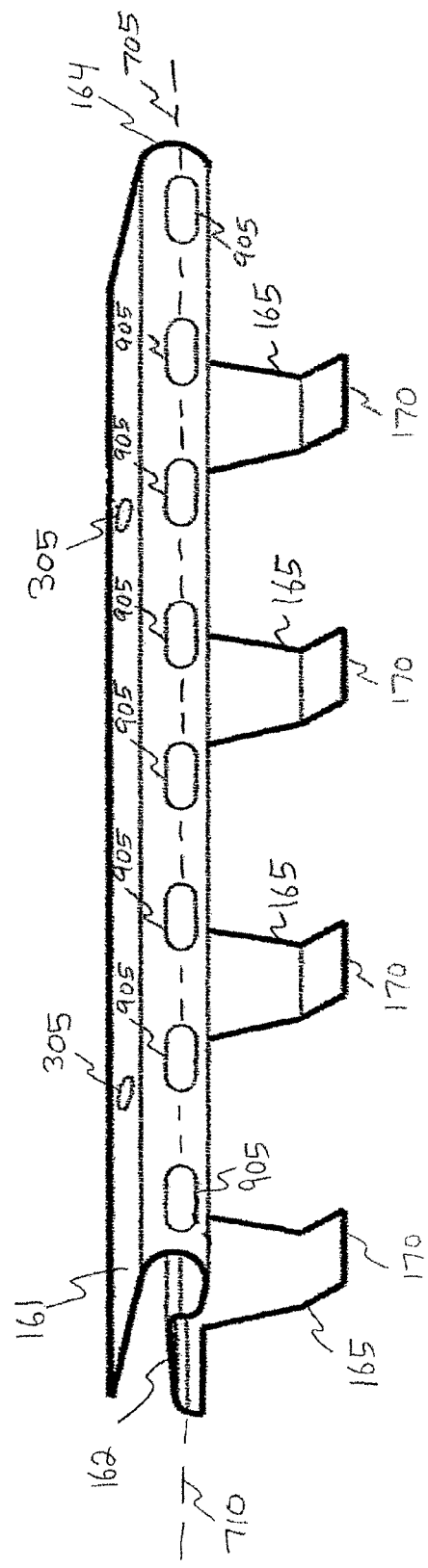
FIG. 10 is a perspective view of one example of the clip of FIG. 9 after being formed into its operational configuration, according to aspects of the present disclosure.

FIG. 9 is a plan view of another example of the clip 155 prior to being formed into its operational configuration. FIG. 10 is a front elevational view of the clip of FIG. 9 after being formed into its operational configuration. Referring to FIGS. 9 and 10, the clip 155 includes a row of openings 905. The location of the row of openings 905 along the horizontal axis 705 controls where a bend occurs between the first leg 161 and the second leg 162 of the first portion 160 of the clip 155 when the clip 155 is formed from the configuration of FIG. 9 to the configuration of FIG. 10. The row of openings 905 also controls bending of the clip 155 during fastening with the fastener 145 and the fastening bar 175. For example, the row of openings 905 facilitates the bending of the first leg 161 and a second leg 162 about the curved portion 164 during fastening as would be understood by one of skill in the art given the benefit of this disclosure.

Figure 11:
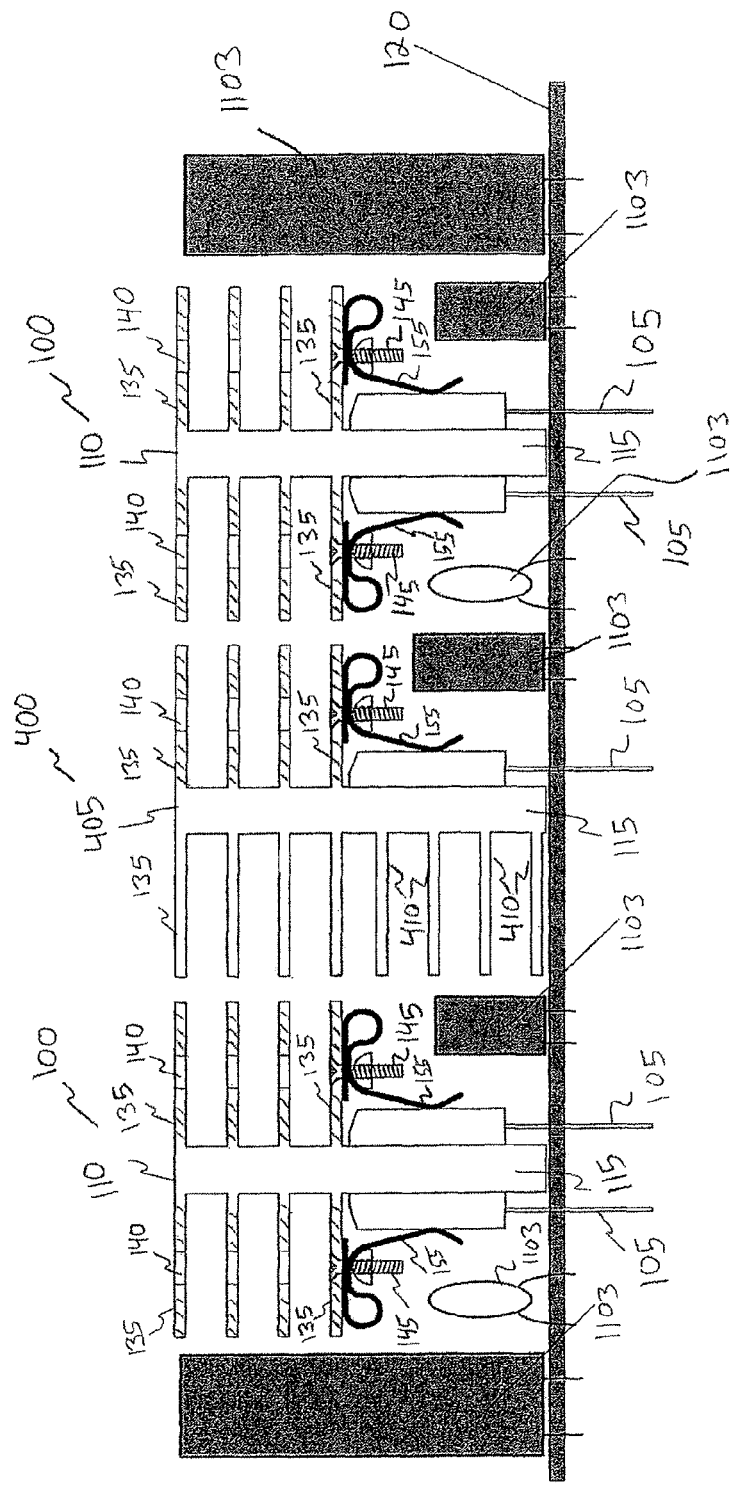
FIG. 11 is a side elevational view of another example of several heat sink assemblies with portions of the heat sink assemblies depicted in cross section, according to aspects of the present disclosure, secured to several electronic components.

FIG. 11 is a side elevational view of another example of several heat sink assemblies 100, 400 secured to electrical components 115. Portions of the assemblies of FIG. 11 are depicted in cross section, such as the fins 135 depicted with the openings 140. FIG. 11 depicts a high density printed circuit board 120 with three heat sink assemblies 100, 400; a middle heat sink assembly 400 disposed between heat sink assemblies 100. Each of the heat sinks 110 has two clips 155, one on each side of the base 115. The heat sink 405 has one clip 155 and the several of the fins 405 disposed opposite the base 115 of the heat sink 405. The clips 155 in the example of FIG. 11 are in the engaged position, and each of the clips 155 secures at least one electronic component 105 to its respective heat sink assembly.

The circuit board 120 also includes several components 1103. The components 1103 are electrical components that are not secured to any of the heat sink assemblies depicted in FIG. 11. The components 1103 and the concentration of the fins 135 and the fins 410 from adjacent heat sink assemblies blocks frontal access to the components 105 that are depicted in FIG. 11. A fastening operation achieved by top down access to the fastener 145 via the openings 140 configures the clips 155 in the engaged position in situations where frontal or lateral access to the lowermost fins 135 is blocked by other heat sink assemblies or the components 1103.

Figure 12:
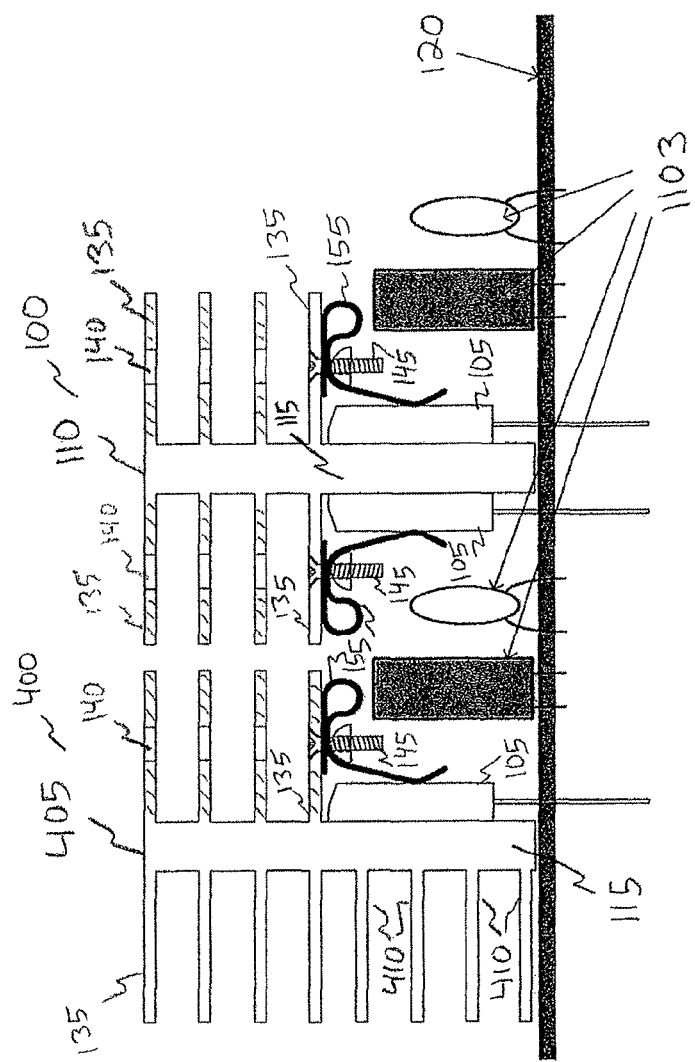
FIG. 12 is a side elevational view of another example of several heat sink assemblies with portions of the heat sink assemblies depicted in cross section, according to aspects of the present disclosure, secured to several electronic components.

FIG. 12 is a side elevational view of another example of several heat sink assemblies. FIG. 12 depicts a high density printed circuit board 120 with a heat sink assembly 100 having the heat sink 405 disposed next to a heat sink assembly having the heat sink 110. Two of the clips 155 are in their engaged positions and are secured to the respective lowermost fin 135 on each side of the base 115 of the heat sink 110. One clip 155 is in the engaged position secured to the lowermost fin 135 on the side of the base 115 that is opposite to the fins 410. Each of the three clips 155 of the example of FIG. 12 secures at least one electronic component 105 to the respective base 115. The components 1103 and the high density placement of the heat sink 110 and the heat sink 405 proximate to each other blocks lateral or frontal access to the clips 155 and to the electronic components 105. The clips 155 are biased to the engaged positions depicted in FIG. 12 by a fastening operation that uses top down access via the respective openings 140.

FIGS. 13A-13E are five side elevational views of one example of a method for securing a heat sink to an electronic component, with portions of the heat sink assembly depicted in cross section, according to aspects of the present disclosure. Referring to FIG. 13A and FIG. 13B, an electrically insulating material 1305 is attached to the base 115 of the heat sink 110 to provide electrical insulation between the heat sink 110 and the electronic component 105. The clip 155 and the fastening bar 175 are positioned beneath one of the lowermost fins 135. The fastener 145 passes through three openings 140 that are aligned with each other and formed in their respective fins 135. The fastener 145 is received by the opening 140 in the lowermost fin 135 and a portion of the fastener 140 engages the clip 155 and the fastening bar 175, with the clip 155 in the disengaged position.

Referring to FIG. 13C, FIG. 13D, and FIG. 13E, the heat sink 110 is placed adjacent to the electronic component 105 and on the printed circuit board 120. Using a screwdriver 1310, the fastener 145 is screw fastened to the fastening bar 175. The resulting force bends the clip 155 from the disengaged position of FIG. 13C to the engaged position of FIG. 13D, where the second portion 165 of the clip 155 contacts the electronic component 105 and secures it to the base 115 of the heat sink 110. A circuit board screw 1315 is also inserted into and through a circuit board opening 1320. A portion of the circuit board screw 1315 extends through the circuit board opening 1320 is threadably received by the base 115 of the heat sink 110. Using the screwdriver 1310, the circuit board screw 1315 screw fastens the heat sink 110 to the printed circuit board 120. Referring to FIG. 13E, the heat sink assembly 100 is depicted in an assembled position where the clip 155 secures the heat sink 110 with the electronic component 105.

Figure 14:
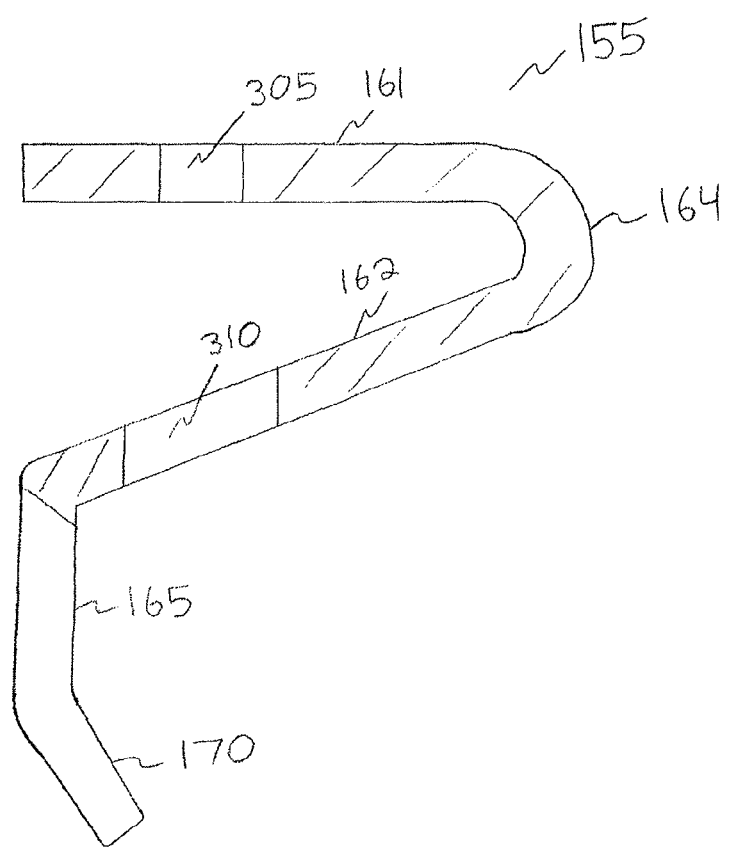
FIG. 14 is a cross-sectional view of a clip of the heat sink assembly according to aspects of the present disclosure.

Referring to FIG. 14, the first leg 161, the second leg 162, and the curved segment 164 form a generally V-shaped configuration, and the clip 155 is in a resting, non-biased position. The first leg 161 of the clip 155 includes the first leg opening 305 and the second leg 162 of the clip 155 includes the second leg opening 310. The angle between the first leg 161 and the second leg 162 defines the V shape and controls biasing of the second portion 165 toward the electronic component.

Figure 15:
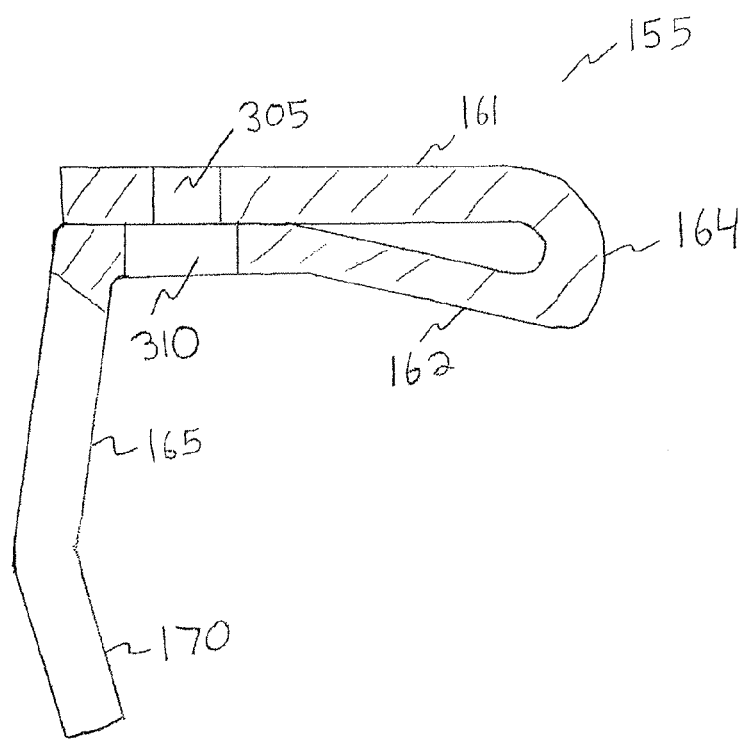
FIG. 15 is a cross-sectional view of a clip of the heat sink assembly according to aspects of the present disclosure.

Referring to FIG. 15, the clip 155 is in the engaged, biased position where the second portion 165 of the clip 155 secures the electronic component with the heat sink (the electronic component and the heat sink are not illustrated in FIG. 15). A portion of the second leg 162 of the clip 155 contacts a portion of the first leg 161 of the clip 155, and the first leg opening 305 is aligned with the second leg opening 310. The application of force by the fastener and the fastening bar (not shown in FIG. 15) drives the first leg 161 and the second leg 162 together. The curved segment 164 of the clip 155, which gives the first portion 160 the generally V-shaped configuration of FIG. 14, closes to form the generally loop or teardrop-shaped configuration of FIG. 15.

Figure 16:
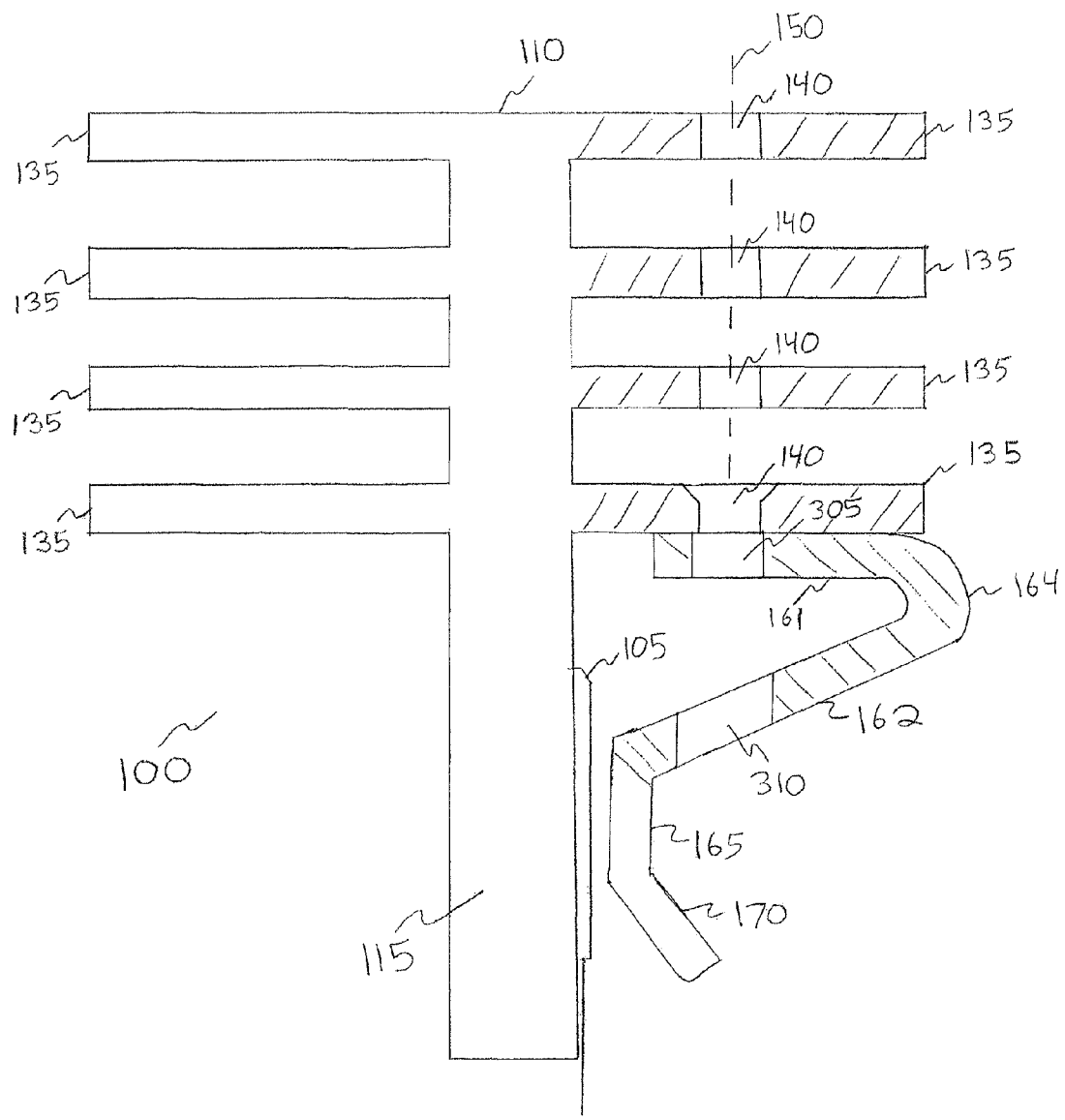
FIG. 16 is a side elevational view of one example of components of a heat sink assembly with portions of some components depicted in cross section, according to aspects of the present disclosure.
Figure 17:
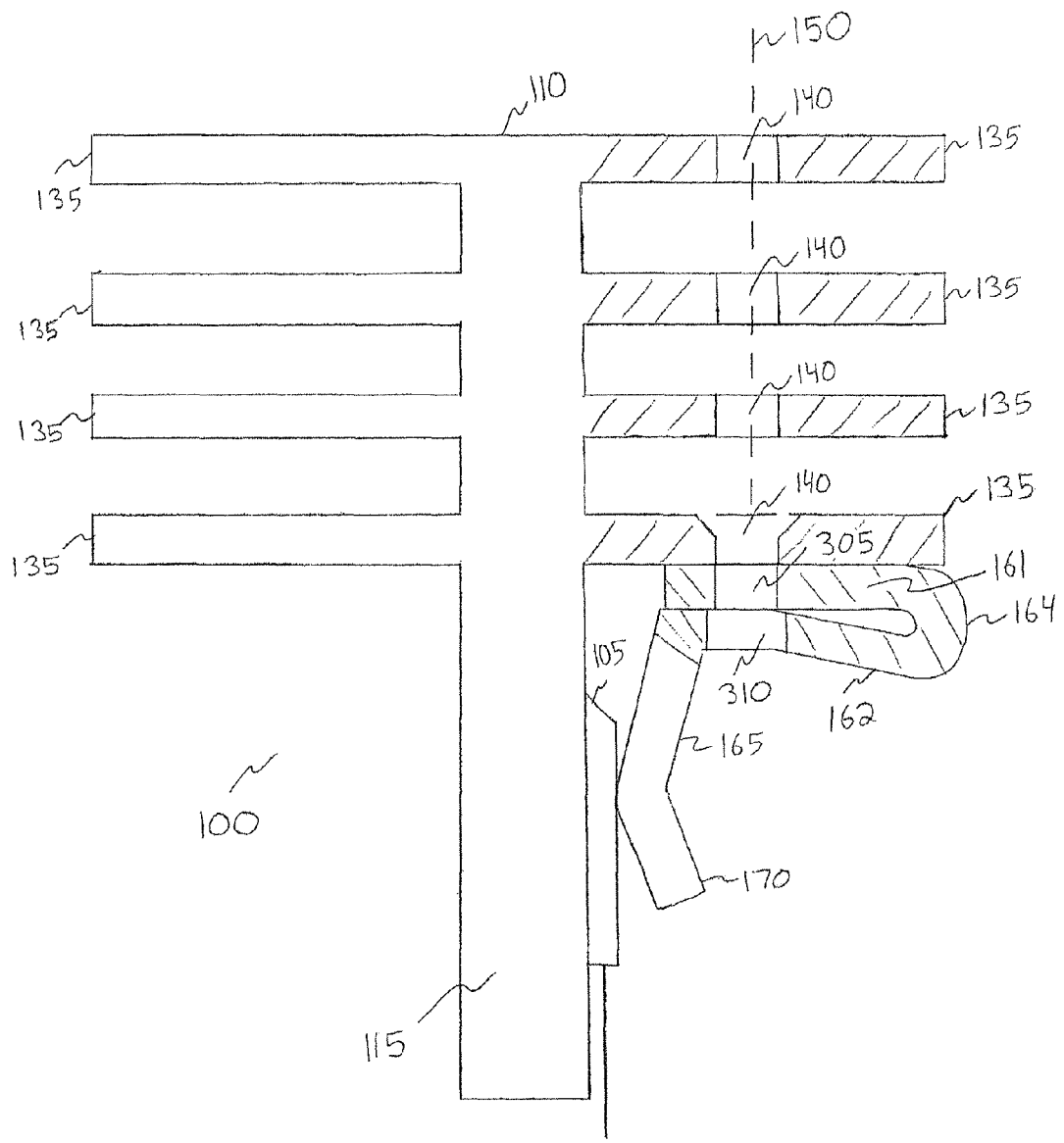
FIG. 17 is a side elevational view of the components of the heat sink assembly shown in FIG. 16, with portions of some components depicted in cross section, according to aspects of the present disclosure.

FIG. 16 depicts the clip 155 in the resting, non-biased position of FIG. 14 configured beneath the lowermost fin 135 of the heat sink assembly 100. The clip 155 in the configuration of FIG. 16 does not contact the electrical component 105. The opening 305 and the opening 310 are aligned with the opening 140 of the lowermost fin 135 to receive the fastener along the vertical axis 150. (The fastener is not depicted in FIG. 16). FIG. 17 depicts the clip 155 in the biased position of FIG. 15, in a fastened configuration against the lowermost fin 135 of the heat sink 110. (The fastener is not depicted in FIG. 17). The clip 155 as depicted in FIG. 17 contacts the electronic component 105, securing it to the base 115 of the heat sink 110 and providing a secure thermal connection between the electronic component 105 and the heat sink 110.

Having now described several aspects of at least one embodiment, it is apparent that various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A heat sink assembly for dissipating heat from an electronic component, the heat sink assembly comprising:
   a heat sink including a base having a surface configured to engage the electronic component, the heat sink further including at least one fin extending from the base in a direction perpendicular to a direction of the surface of the base, the at least one fin having a first surface, a second surface opposite the first surface, and an opening formed therein extending from the first surface to the second surface, the opening being configured to receive a fastener; and
   a clip including a first portion having a first leg configured to engage the second surface of the at least one fin and a second leg coupled to the first leg by a curved portion, the second leg being spring biased away from the first leg, the clip further including a second portion coupled to the first portion, the second portion being configured to engage the electronic component to secure the heat sink to the electronic component proximate to the base in response to a force being applied to the second leg by the fastener in which the second leg engages the first leg.

2. The heat sink assembly of claim 1, wherein the first leg has a first leg opening and the second leg has a second leg opening, the first leg opening and the second leg opening being configured to receive the fastener and aligned with the opening of the at least one fin.

3. The heat sink assembly of claim 2, further comprising a fastening bar configured to compress the second leg against the first leg when securing the fastening bar and the clip to the at least one fin and to spring bias the second portion against the electronic component.

4. The heat sink assembly of claim 3, wherein the fastening bar includes a fastener bar opening configured to receive the fastener and aligned with the opening of the at least one fin, the first leg opening and the second leg opening.

5. The heat sink assembly of claim 1, wherein the first leg and the second leg are configured to pivot about the curved portion responsive to the force being applied to the first portion by the fastener.

6. The heat sink assembly of claim 5, wherein the curved portion is configured to form a loop responsive to the force being applied to the first portion by the fastener.

7. The heat sink assembly of claim 1, wherein the clip includes a plurality of second portions spatially positioned along a length of the first portion, the plurality of second portions being configured to secure a plurality of electronic components proximate to the base of the heat sink.

8. A heat sink assembly for dissipating heat from an electronic component, the heat sink assembly comprising:
a heat sink including a base having a first surface configured to engage the electronic component, the heat sink further including a first fin extending from the first surface of the base, the first fin having a first opening formed therein that is configured to receive a fastener, and a second fin extending from the first surface of the base, the second fin being disposed above the first fin and having a second opening aligned with the opening of the first fin and configured to receive the fastener therethrough, the first fin and the second fin extending from the base in a direction perpendicular to a direction of the base, the first fin having a top surface and a bottom surface opposite the first surface; and
a clip including a first portion having a first leg and a second leg coupled to the first leg by a curved portion, the second leg being spring biased away from the first leg, each of the first leg and the second leg having a clip opening formed therein and configured to be aligned with the first opening of the first fin to receive the fastener to secure the clip to the first fin in response to a force being applied to the first portion by the fastener.

9. The heat sink assembly of claim 8, wherein the clip includes a second portion configured to spring bias the electronic component against the base of the heat sink in response to the force being applied to the first portion by the fastener.

10. The heat sink assembly of claim 9, wherein the first fin and the second fin extend from the base in a parallel configuration.

11. The heat sink assembly of claim 8, further comprising:
a third fin extending from a second surface of the base opposite to the first surface of the base, the third fin having an opening formed therein that is configured to receive a second fastener.

12. The heat sink assembly of claim 8, wherein a top surface of the first portion of the clip is configured to contact the bottom surface of the first fin responsive to the force being applied to the first portion by the fastener.

13. The heat sink assembly of claim 8, further comprising:
a fastening bar having an opening formed therein that is configured to threadably receive the fastener to secure the clip to the heat sink.

14. A method of securing a heat sink assembly to an electronic component, the heat sink assembly including a clip and a heat sink, wherein the heat sink includes a base having a surface configured to engage the electronic component, the heat sink further including a first fin extending from the base in a direction perpendicular to a direction of the surface of the base, the first fin having a top surface, a bottom surface opposite the top surface, and a first opening formed therein extending from the top surface to the bottom surface, the first opening being configured to receive a fastener, wherein the clip includes a first portion having a first leg configured to engage the bottom surface of the at least one fin and a second leg coupled to the first leg by a curved portion, the second leg being spring biased away from the first leg, the clip further including a second portion coupled to the first portion, the second portion being configured to engage the electronic component to secure the heat sink to the electronic component proximate to the base in response to a force being applied to the second leg by the fastener in which the second leg engages the first leg, the method comprising:
positioning the heat sink assembly on the electronic component in such a manner that the base is disposed adjacent the electronic component;
attaching the first portion of the clip to the bottom surface of the first fin of the heat sink;
applying force to the second leg of the clip toward the first leg of the clip to drive a movement of the second portion of the clip against the electronic component.

15. The method of claim 14, wherein applying force to the second leg of the clip toward the first leg of the clip positions at least a portion of a surface of the electronic component adjacent to the base of the heat sink, and positions at least a portion of a top surface of the electronic component proximate to the bottom surface of the fin of the heat sink.

16. The method of claim 15, further comprising:
biasing the second portion of the clip toward the electronic component to secure the portion of the surface of the electronic component against a surface of the base of the heat sink with a fastener that secures the clip to the first fin of the heat sink.

17. The method of claim 16, wherein the heat sink further includes a second fin disposed above the first fin, the second fin having a second opening aligned with the first opening of the first fin, the method further comprising:
securing the fastener by accessing the fastener through the second opening of the second fin of the heat sink.

* * * * *